US009525096B2

(12) United States Patent
Kim et al.

(10) Patent No.: US 9,525,096 B2
(45) Date of Patent: Dec. 20, 2016

(54) PLATING EQUIPMENT FOR SOLAR CELL WAFER USING ELECTROPLATING AND LIGHT-INDUCED PLATING JOINTLY AND METHOD OF THE SAME

(71) Applicant: HOJIN PLATECH CO., LTD., Ansan-Si (KR)

(72) Inventors: Pan Soo Kim, Yongin-Si (KR); Duk Haeng Lee, Bucheon-Si (KR); Woon Suk Jung, Ansan-Si (KR)

(73) Assignee: HOJIN PLATECH CO., LTD., Ansan-Si (KR)

( * ) Notice: Subject to any disclaimer, the term of this patent is extended or adjusted under 35 U.S.C. 154(b) by 289 days.

(21) Appl. No.: 14/174,736

(22) Filed: Feb. 6, 2014

(65) Prior Publication Data

US 2014/0154836 A1    Jun. 5, 2014

Related U.S. Application Data

(63) Continuation of application No. PCT/KR2013/000060, filed on Jan. 4, 2013.

(30) Foreign Application Priority Data

Jan. 17, 2012   (KR) ......................... 10-2012-0005089

(51) Int. Cl.
   *C25D 7/12*     (2006.01)
   *H01L 31/18*    (2006.01)
   (Continued)

(52) U.S. Cl.
   CPC ........... *H01L 31/18* (2013.01); *C23C 18/1653* (2013.01); *C25D 5/006* (2013.01); *C25D 7/126* (2013.01);
   (Continued)

(58) Field of Classification Search
   CPC ...................................................... C25D 7/126
   See application file for complete search history.

(56) References Cited

U.S. PATENT DOCUMENTS

| 4,251,327 A | | 2/1981 | Grenon | |
|---|---|---|---|---|
| 5,985,123 A | * | 11/1999 | Koon | ....................... C25D 5/08 |
| | | | | 204/198 |

(Continued)

FOREIGN PATENT DOCUMENTS

| DE | 102007038120 A1 | 2/2009 |
|---|---|---|
| DE | 102009051688 A1 | 4/2011 |

(Continued)

OTHER PUBLICATIONS

International Search Report and Written Opinion for International Application No. PCT/KR2013/000060 dated Apr. 22, 2013 (18 pages)..

(Continued)

*Primary Examiner* — Bryan D. Ripa
(74) *Attorney, Agent, or Firm* — Perkins Coie LLP

(57) ABSTRACT

The present invention relates to plating equipment and method for a solar cell wafer using electroplating and light-induced plating jointly. The plating equipment includes a jig allowing a wafer (1), that is a body to be plated, to be vertically immersed into a plating solution at a center of a plating bath (209), a first plating unit (200) comprising a plurality of anode members (210) symmetrically disposed on both sides of the plating bath (209) facing the wafer (1), the first plating unit performing electroplating; and a second plating unit (300) disposed in a light source receiving unit (320) physically blocked from the first plating unit (200), the second plating unit (300) being disposed at a rear side of the (Continued)

anode members (210) to perform light-induced plating by using an light emitting diode (LED) lamp (301) irradiating light onto the wafer (1).

13 Claims, 6 Drawing Sheets

(51) Int. Cl.
*C25D 17/00* (2006.01)
*H01L 31/0224* (2006.01)
*C25D 17/06* (2006.01)
*C23C 18/16* (2006.01)
*H01L 21/67* (2006.01)
*C25D 5/00* (2006.01)
*C25D 17/12* (2006.01)
*C25D 21/12* (2006.01)
*C25D 5/08* (2006.01)

(52) U.S. Cl.
CPC ............. *C25D 17/001* (2013.01); *C25D 17/06* (2013.01); *C25D 17/12* (2013.01); *H01L 21/6723* (2013.01); *H01L 31/022425* (2013.01); *C25D 5/08* (2013.01); *C25D 17/008* (2013.01); *C25D 21/12* (2013.01); *Y02E 10/50* (2013.01)

(56) References Cited

U.S. PATENT DOCUMENTS

| | | | |
|---|---|---|---|
| 2011/0062028 A1* | 3/2011 | Lippert | C25D 5/00 205/91 |
| 2012/0000785 A1* | 1/2012 | Zahraoui | C25D 17/001 205/91 |
| 2012/0025711 A1* | 2/2012 | Best | F21S 8/086 315/113 |

FOREIGN PATENT DOCUMENTS

| | | |
|---|---|---|
| JP | 2001-274439 A | 10/2001 |
| JP | 4014525 B2 | 9/2007 |
| KR | 10-0477443 B1 | 3/2005 |
| KR | 10-2011-0110761 A | 10/2011 |
| TW | 200919760 | 5/2009 |
| WO | 2010-108996 A1 | 9/2010 |

OTHER PUBLICATIONS

European Search Report dated Sep. 4, 2015 for European Patent Application No. 13738076.2, filed Mar. 6, 2014 (8 pages).
Office Action dated Dec. 3, 2015 for Chinese Patent Application No. 201380002716.9 (6 pages).

* cited by examiner

PLATING EQUIPMENT FOR SOLAR CELL WAFER USING ELECTROPLATING AND LIGHT-INDUCED PLATING JOINTLY AND METHOD OF THE SAME

CROSS REFERENCE TO RELATED APPLICATIONS

This application is a continuation of, under 35 U.S.C. §120, International Application No. PCT/KR2013/000060, filed on Jan. 4, 2013, which claims priority of Korean Patent Application No. 10-2012-0005089, filed on Jan. 17, 2012, the entire contents of which are hereby incorporated by reference.

TECHNICAL FIELD

The present invention relates to a method for plating for forming a circuit on a silicon wafer substrate when manufacturing a solar cell.

BACKGROUND

Recently, there has been a growing interest in new and renewable energy due to a global environmental issue, for example, depletion of fossil energy, waste disposal of nuclear power generation, and site selection for construction of new power plants, and the like. Most of all, research and development in the field of solar energy generation, that is, a non-polluting energy source, is actively conducted worldwide. The amount of energy that the earth receives from the sun is about 10,000 times more than the amount of energy consumption in the earth.

Solar cells are devices for directly converting solar photovoltaic energy into electrical energy. The solar cells have difficulties in commercialization due to their economic feasibility. To replace traditional generation means such as fossil energy and the like, the solar energy needs to be more economical or be economically competitive than the traditional generation means. Thus, techniques relating to solar energy are being focused on the increase of generation efficiency as well as the improvement of economic feasibility.

Moreover, to manufacture such solar cells, a circuit needs to be formed on a wafer substrate. Techniques for forming the circuit can be largely divided into a screen printing method and a plating method. The screen printing method is a printing method using silver paste. However, as silver (Ag) increases in price, price competitiveness of products may be low, and also, electrical conductivity may be deteriorated due to impurities such as binder and glass bid led that constituting silver paste. Thus, there is a limitation in efficiency of electricity conversion. As a result, technologies using plating are being actively carried out in the recent years.

SUMMARY

One implementation of the disclosed technology in this patent document is to provide plating equipment and method in which light-induced plating (LIP) type electroless plating and electrolytic plating, so-called electroplating capable are simultaneously performed.

Further, one implementation of the disclosed technology in this patent document is to provide plating equipment that is easily maintained and repaired.

Further, one implementation of the disclosed technology in this patent document is to provide plating equipment that simultaneously performs plating on both surfaces of a wafer and is applied to mass production facilities to improve economic feasibility in solar cells.

Other implementations that are not described in the description can be taken into account in the scope of the present invention and their effects provided in the following description.

Embodiments of the present invention provides plating equipment for a solar cell wafer using electroplating and light-induced plating jointly includes: a jig allowing a wafer, that is a body to be plated, to be vertically immersed into a plating solution at a center of a plating bath; a first plating unit comprising a plurality of anode members symmetrically disposed on both sides of the plating bath facing the wafer, the first plating unit performing electroplating; and a second plating unit disposed in a light source receiving unit physically blocked from the first plating unit, the second plating unit being disposed at a rear side of the anode members to perform light-induced plating by using an light emitting diode (LED) lamp irradiating light onto the wafer.

In some embodiment, the plurality of anode members may have the same width and spaced apart from each other at the same distance as a width of each of the anode members in the plating bath, and when the light-induced plating is performed, the jig may be controlled to move the wafer in a direction parallel to that of the anode member in the plating solution so that an area on which reception of light emitted from the LED lamp is disrupted according to a position of the anode member is uniformly distributed on the surface of the wafer.

In other embodiment, a barrier may be disposed between the first and second plating units to prevent the plating solution in the plating bath from being permeated into the light source receiving unit, and the barrier may be formed of a transparent material through which light is transmitted.

In still other embodiment, a ventilation hole or an air blower may be disposed in a back surface (a surface opposite to the plating bath) of the light source receiving unit to prevent dew from being generated on the barrier when the LED lamp operates.

In further embodiment, the light induced plating may be performed by using the second plating unit to form a seed layer on the surface of the wafer, and then the electroplating may be lonely performed by using the first plating unit, or the electroplating and the light-induced plating may be jointly performed by using the first plating unit.

In other embodiments of the present invention, plating methods for a solar cell wafer using a plating bath containing a plating solution include: (a) irradiating light (performing light-induced plating) onto a wafer, which is an object to be plated and vertically mounted at a center of a plating bath, by using LED lamps, that are respectively disposed on both side surfaces of the plating bath, to form a seed layer on each of both surfaces of the wafer; and (b) performing electroplating on both surfaces of the wafer, on which the seed layer is formed, by using an anode member disposed on a front side of each of the LED lamps.

In some embodiment, the performing of the electroplating (the step (b)) may include performing the electroplating in a state where the LED lamps are turned off or on.

In other embodiment, while the light-induced plating is performed by the LED lamps, the wafer may move in parallel with the anode member within the plating solution.

According to one implementation of the disclosed technology in this patent document, since the LIP-type electroless plating and electroplating are sequentially or simultaneously performed through one single plating process in a single plating equipment, manufacturing time and costs for the solar cells may be reduced.

Also, according to one implementation of the disclosed technology in this patent document, since both sides of the wafer are simultaneously plated, the plating equipment may have high efficiency in mass production facilities.

Also, according to one implementation of the disclosed technology in this patent document, the plating equipment may be easily maintained and repaired. The effects expected to have ordinary and provisional effects by technical characteristics of the present invention can be regarded as the effects described in the description, although it is not described in detail in the present invention.

The exemplified accompanying drawings are used to illustrate the technical idea, thus, the scope of protective rights of the present invention shall not construed as being limited by the embodiments.

DETAILED DESCRIPTION

Hereinafter, embodiments of the present invention will be described in more detail with reference to the accompanying drawings. Moreover, detailed descriptions related to well-known functions or configurations obvious to those skilled in the art that the present invention will be ruled out in order not to unnecessarily obscure subject matters of the present invention.

Figure 1:
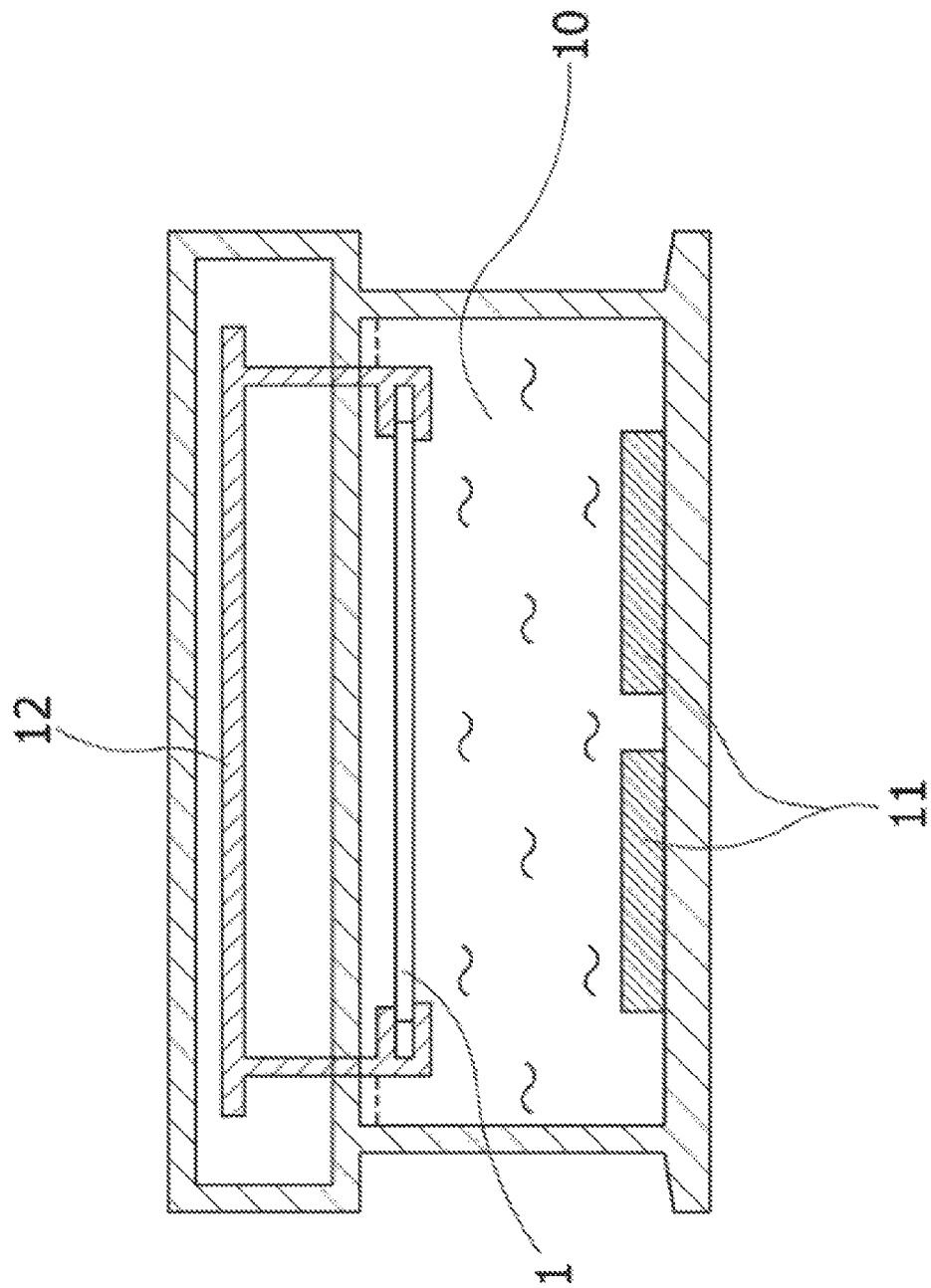
FIG. 1 is a schematic view explaining a structure of a plating method using an anode electrode installed on a bottom surface of a plating bath and a circuit.

FIG. 1 shows a schematic view explaining a plating method. In the electroplating method as shown in FIG. 1, a wafer 1 is held by a jig 12 containing a plating solution and is mounted in a plating bath 10 and an anode electrode 11 installed on a bottom surface of the plating bath 10 and a circuit are configured to plate the wafer 1. However, according to the plating method as shown in FIG. 1, it is difficult to replace and maintain the anode electrode 11 disposed on the bottom surface. Furthermore, it is impossible to simultaneously plate both sides of the wafer, and there are limitations in applying a manner of loading the wafer 1 into the plating bath 10 one by one to mass production facilities.

Figure 2:
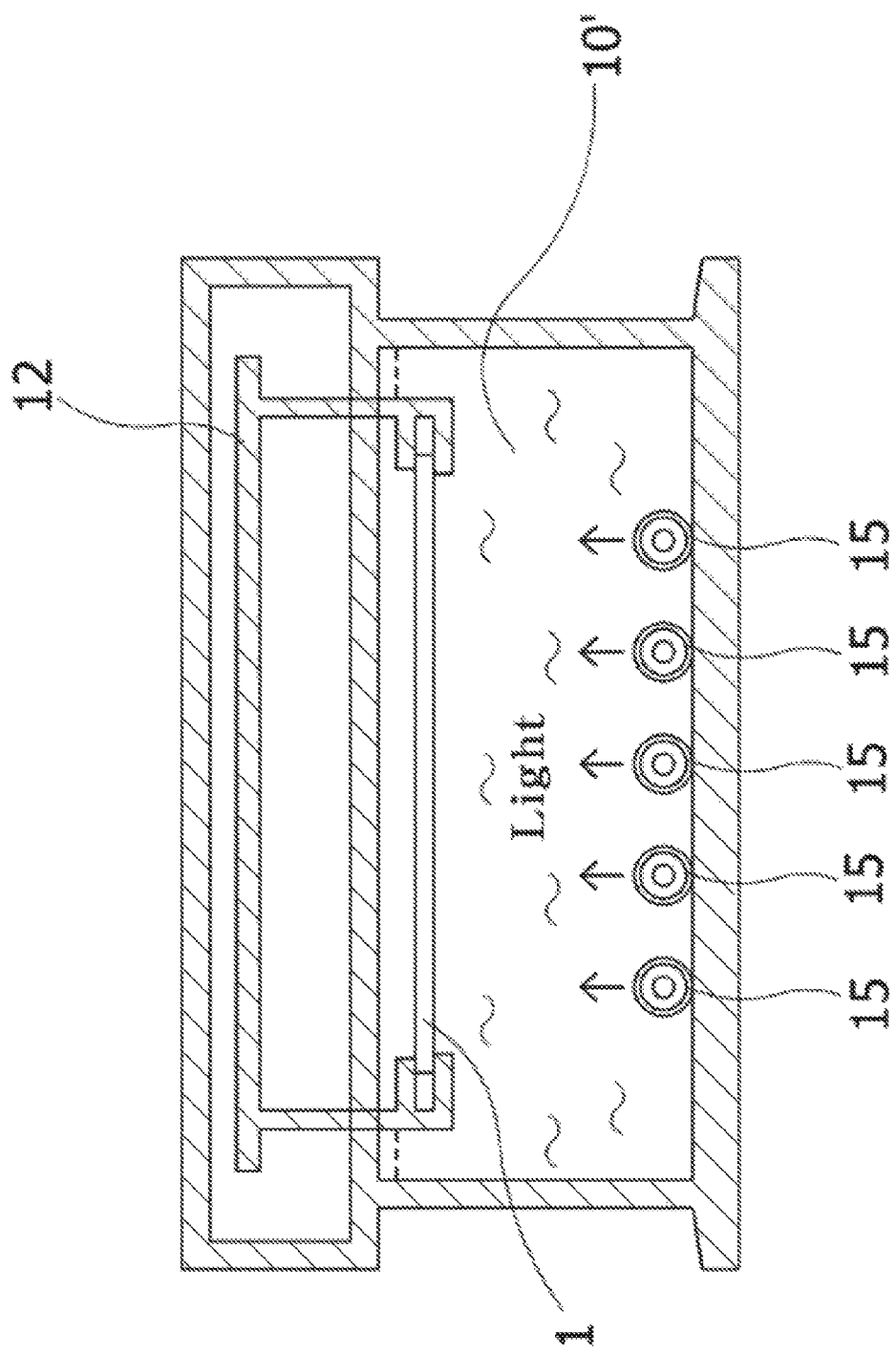
FIG. 2 is a schematic view explaining a structure of an electroless plating method using an light emitting diode (LED) lamp.

FIG. 2 shows a schematic view explaining an electroless plating method, in particular, light induced plating (LIP). As shown in FIG. 2, a wafer 1 is mounted into a plating bath 10' and then, an light emitting diode (LED) lamp is installed in a quartz tube disposed at a bottom surface of a plating bath 10'. Then, the wafer 1 is plated by using the light emitted from the LED lamp. However, according to the LIP method, there are several difficulties in reliability, repair, and replacement of the LED lamp disposed at the bottom surface of the plating bath 10'. Also, as discussed in relation to the plating method as shown in FIG. 1, it is impossible or difficult to simultaneously plate the two sides of the wafer 1, and there are limitations in applying a manner of loading the wafer 1 into the plating bath 10' one by one to mass production facilities.

Moreover, according to the plating methods as shown in FIGS. 1 and 2, an entire substrate needs to be mounted in a plating bath horizontally. Due to this, the precise processing of plating jigs and equipment are required and also their maintenances are difficult. Furthermore, it is impossible or difficult to perform electroplating and LIP simultaneously. In addition, if a seed layer is not formed on wafer, since it is difficult to perform electroplating, a conductive layer is required to be formed in advance so as to perform electroplating processes. For this, after a plating process using LIP is performed, an actual electroplating is separately performed. However, since such processes are performed in separate facilities, costs and manufacturing times are increased.

Figure 3:
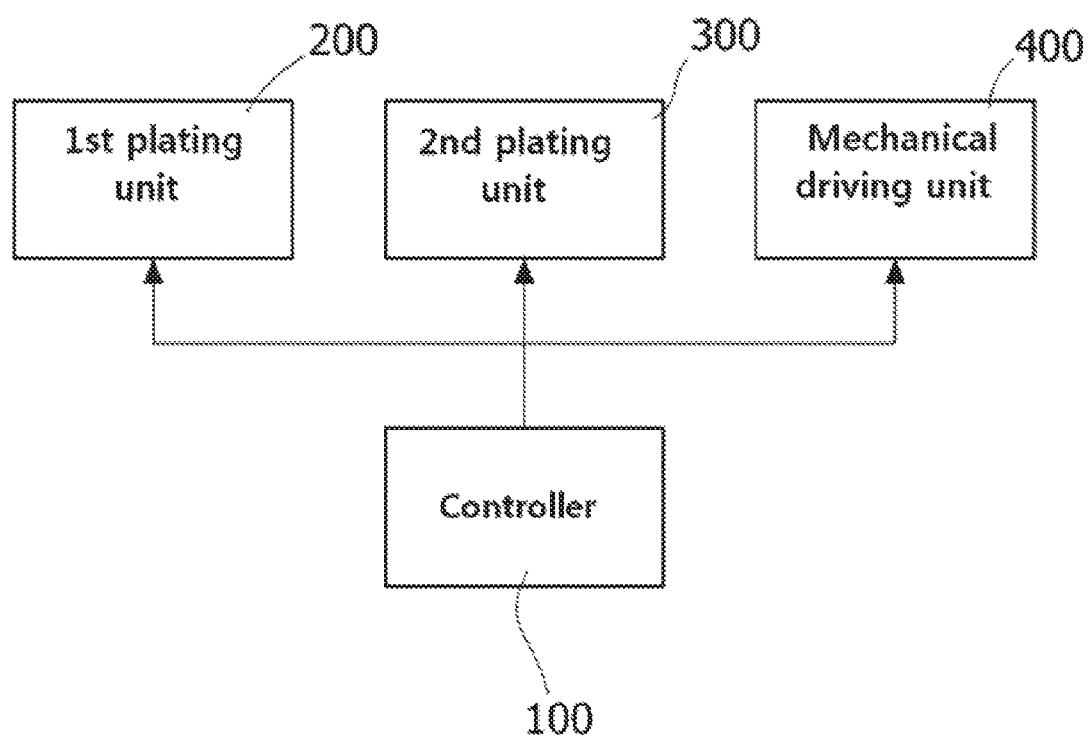
FIG. 3 is a schematic view illustrating a structure of a plating system according to the present invention.

FIG. 3 is a schematic view illustrating a structure of a plating system according to one implementation of the disclosed technology in this patent document. As illustrated in FIG. 3, plating equipment includes two plating units including a first plating unit 200 and a second plating unit 300. The plating equipment further includes a mechanical driving unit 400 performing a series of operations related to a position and operation of a jig for holding a wafer. In addition, a controller 100 driven by a control solution in which a computer and computer program are installed may control selective or combined operations and accurate mechanical driving of the plating units 200 and 300. Although not shown, a predetermined power source and electrical elements may be added.

The first plating unit 200 performs electrolytic plating. The second plating unit 300 includes a light emitting diode (LED) lamp for performing light-induced plating (LIP).

Figure 4:
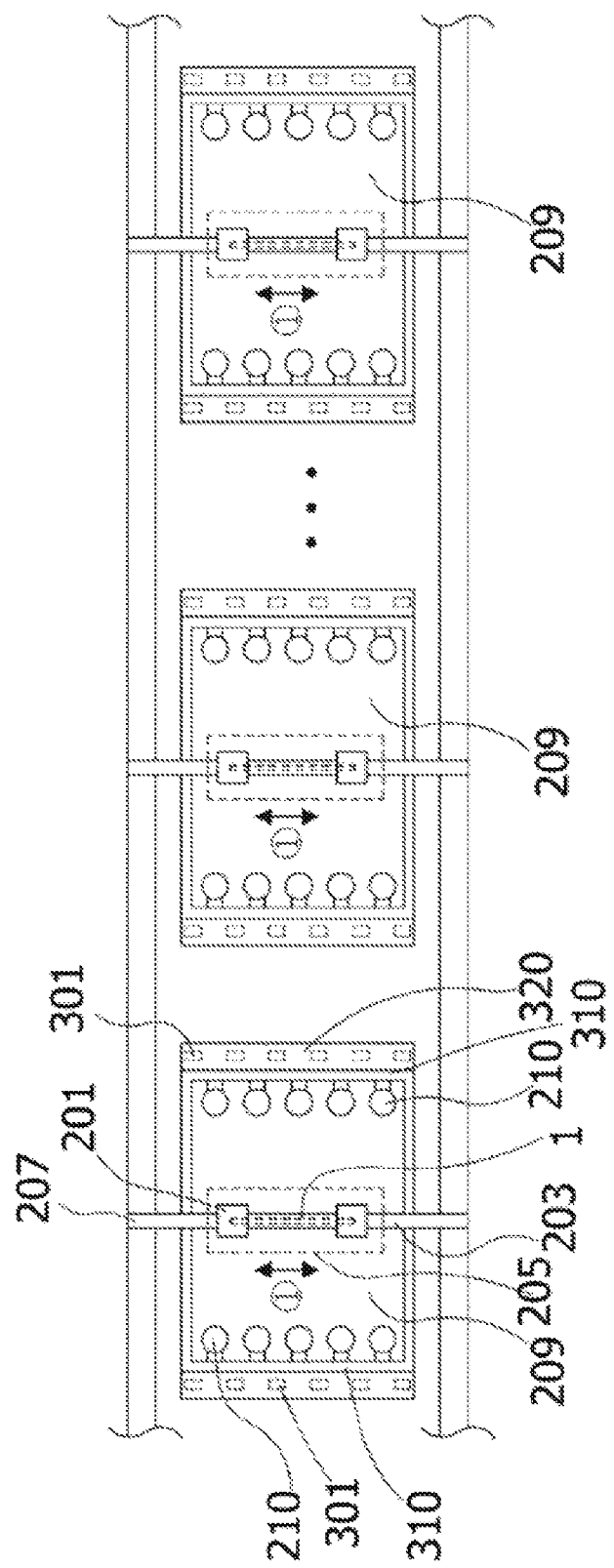
FIG. 4 is a schematic view illustrating a structure of plating equipment according to an embodiment of the present invention.

FIG. 4 is a schematic view illustrating a structure of plating equipment according to one implementation of the disclosed technology in this patent document. Plating baths 209 may be arranged in parallel. The current implementation relates to a vertical rack plating equipment.

Each of the plating baths 209 is filled with a plating solution. A wafer 1 holded by a jig 201 that is disposed movable in an arrow direction along a support 203 may vertically move into the plating bath 209 and then be immersed into the plating solution. As illustrated in FIG. 4, the wafer 1 that is an object to be plated (hereinafter, referred to as a "body to be plated") may be vertically immersed into the plating solution at the center of the plating bath.

Figure 5:
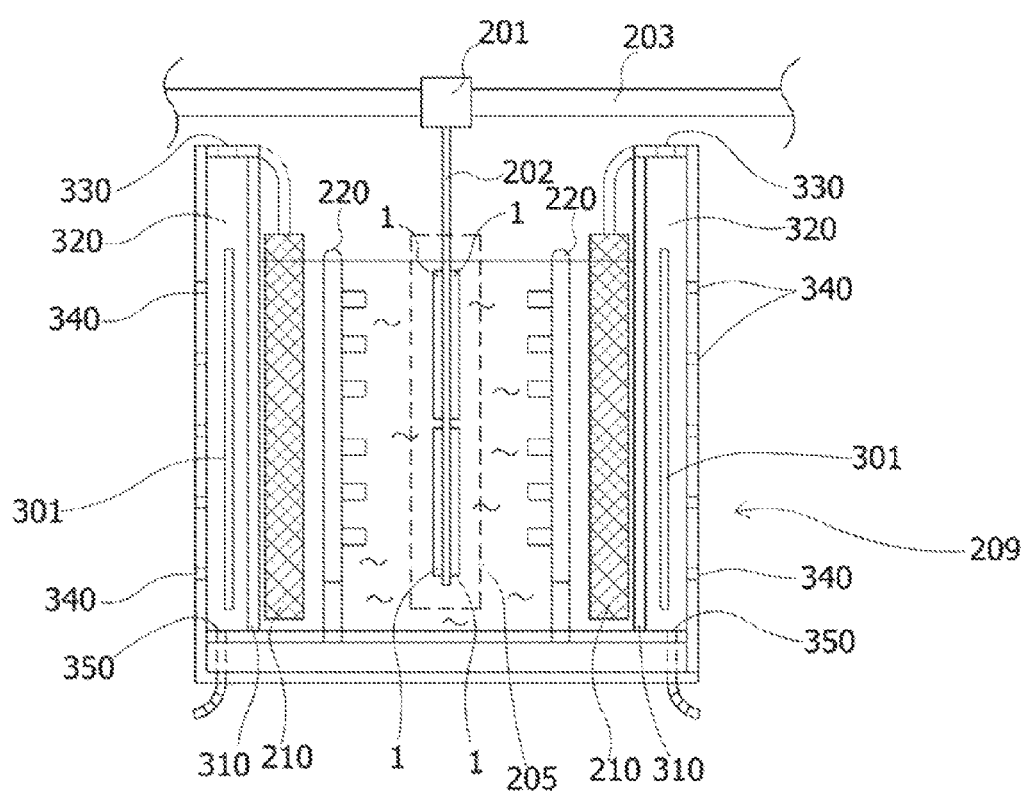
FIG. 5 is a detailed view illustrating a structure of a plating bath 209 of FIG. 4.

The first plating unit 200 and the second plating unit 300 are disposed on both sides of the wafer 1. The first plating unit includes a plurality of anode members 210 disposed symmetrically on both sides of the plating bath to face a cathode disposed at the center of the plating bath 209. The anode members 210 may be parallelly disposed at a predetermined distance. In FIGS. 4 and 5, each of the anode members is provided in a bus bar shape. The second plating unit is disposed in a light source receiving unit 320 that is physically blocked from the first plating unit on both side surfaces of the plating bath 209 to form an independent space.

The light source receiving unit 320 is located on both sides of the plating bath 209, and an LED lamp 301 that is used as a light source is disposed in an inner space of the light source receiving unit 320. Also, a barrier 310 may be disposed between the light source receiving unit 320 and the plating solution of the plating bath 209 to prevent the plating solution from flowing into the light source receiving unit 320.

As described above, the anode members 210 including cylindrical anode bus bars may be disposed on front surfaces of both sides of the barrier 310 to perform electroplating, and an anode ball having a globular shape may be put into each of the anode bus bars. Various changes may be suggested in relation to a configuration of the anode. For example, as illustrated in FIGS. 4 and 5, to maximize a surface area of the anode, a plurality of globular anode balls may be put into the cylindrical anode bus bars having a lattice shape (Ball Type). Alternatively, an anode member having a star shape in section may be hung on an anode hook (Star Type). In order to maximize the surface area of the anode, a titanium basket or the star type anode may be utilized, which reduces light refraction and blocking effects due to the installation of the anode.

As illustrated in FIG. 4, the plurality of anode members 210 may be arranged at a predetermined distance on a front side of the LED lamps 301. Light emitted from the LED lamp may be easily transmitted to the substrate between the anodes. However, the light may be blocked by the anodes on portions on which the anodes are disposed. It is necessary to uniformly distribute the light blocked by the anodes onto a solar cell wafer. The anode members 210 may be spaced apart from one another at the same distance as a width thereof. Thus, the amount of light received onto the surface of the wafer 1 may be uniformly maintained. If the distance between the anode members is narrower or wider than the width of each anode member 210, the light irradiated by the LED lamp is nonuniformly emitted onto the surface of the wafer due to the anode members. In order to ensure the uniform distribution of the light, the plurality of anode members 210 may have the same width and be spaced apart from one another at the same distance as the width thereof.

As illustrated in FIG. 4, the jig 201 holding the wafer may be moved in a direction of an arrow ①. The wafer moves in a direction parallel with the anode members. Under this configuration, an area on which the reception of light is disrupted due to the position of the anode may be exposed toward the LED lamp. The moving speed, distance, and time of the 201 jig may be preset in a computer control device.

FIG. 5 is a detailed view illustrating a structure of a unit plating bath 209 of FIG. 4. The light source receiving units 320 may be disposed on both sides of the plating bath 209 and be symmetrical to each other to face the wafer 1 immersed at the center of the plating bath. Here, the barrier 310 may be disposed to prevent the plating solution from flowing into the light source receiving units 320. The anode bus bars may be disposed at the front side of the barrier 310 (in a direction facing the center of the wafer 1).

The barrier 310 may be formed of a transparent material such as glass, tempered glass, poly carbonate, PVC, and acryl and have chemical resistance so as to minimize the effect with respect to light transmission. Also, an openable cover 330 for the maintenance and replacement of the LED lamp 301 when the LED lamp 301 is broken or damaged may be disposed on the upper portion of the barrier 310. A cover member may be disposed on the upper portion, or an openable part may be disposed on an outer wall of the plating bath, which will be shown in FIG. 6.

A gasket (not shown) may be disposed on a certain portion of the barrier 310 to prevent plating chemicals from flowing into the light source receiving units 320. The gasket may be formed of a material having chemical resistance such as viton, soft polypropylene, soft polyethylene, soft rubber to prevent the plating chemicals from being introduced into the light source receiving units.

However, as the gasket becomes aged or weakened, the plating chemicals of the plating bath 209 may flow into the light source receiving units 320. To address this issue, a drain hole 350 may be defined in the bottom surface of each of the light source receiving units 320 to prevent the LED lamp from being damaged due to the introduction of the plating chemicals.

Also, the LED lamp 301 may be manufactured in a tube or sealed panel shape for waterproofing in case where the LED lamp 301 is waterlogged.

When the LED lamp 301 operates, dewdrops resulting from dew condensation on the surface of the transparent barrier may occur by a temperature difference between the barrier and the plating bath due to heat emission of the LED lamp 310. Also, the dewdrops have a bad influence on the plating because the dewdrops interrupt the transmission of light. For this, a ventilation hole 340 or an air blower may be disposed in an outer surface of each of the light source receiving units 320 (a direction opposite to that the plating bath) to circulate air.

A shield 205 may be disposed in the form of a cathode bar around the substrate to secure uniformity of a metal film plated on the plated body. A phenomenon in which current is overflowed to corners and edges due to the drift of magnetic fields may occur during the plating process. The shield 205 may prevent the current from partially passing therethrough. The shield 205 may be manufactured a floating type by using polypropylene or polyethylene so that the shield is disposed at the same position as the jig when the jig for the solar cell wafer is loaded on the cathode bar.

Also, a sparge nozzle 220 may be disposed between the anode and cathode to obtain a high plating deposition rate. The sparge nozzle 220 may be formed of the same material as the barrier 310 or a transparent material different form that of the battier 310 so that the light is easily transmitted.

Figure 6:
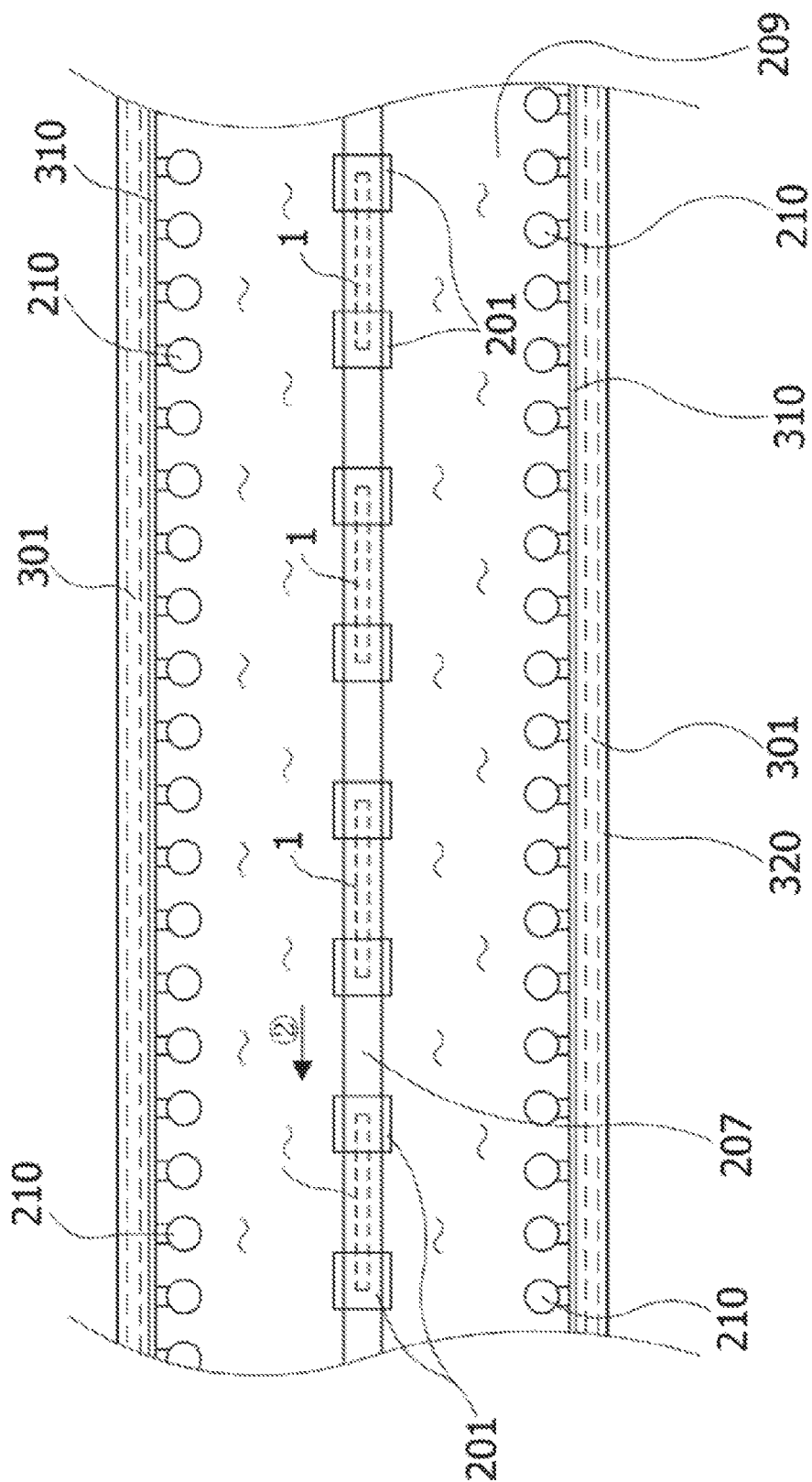
FIG. 6 is a schematic view illustrating a structure of plating equipment according to another embodiment of the present invention.

FIG. 6 is a schematic view illustrating a structure of plating equipment according to another implementation of the disclosed technology in this patent document. In the present implementation, plating baths 209 are continuously disposed in a longitudinal direction thereof. Wafers 1 may be plated while jigs respectively holding the wafers 1 are transferred at a predetermined speed in the longitudinal direction (as indicated as the direction ②) above the plating baths 209. This can be implemented in a vertical continuous plating equipment.

A first plating unit and a second plating unit of FIG. 6 may have the same structure as those of FIG. 4. However, a wafer of FIG. 6 may be transferred in one direction of an arrow ② ②, while the wafer of FIG. 4 moves in both directions.

Anode members 210, LED lamps 301, and other plating members (not shown) (referring to FIG. 5) may be disposed spaced at a predetermined distance from one another in a longitudinal direction of the plating baths. As a result, light generated from the LED lamps 301 and blocked by the anode members 210 may be uniformly emitted to the wafers 1, and thus the bad influence due to the light blocking may be minimized.

The plating baths 209 do not move, and the jigs holding the wafers 1 may be mechanically transferred. In the current embodiment, each of the wafers vertically immersed into the plating baths moves in parallel with each of the anode members. Under this configuration, as the wafer is transmitted in parallel with the anode member, an area on which the reception of light is disrupted due to the position of each of the anode members may be exposed toward the LED lamps. A moving speed, method, and time of the jig may be preset in a computer control device.

As discussed above, when the light-induced plating is performed, the jig may be controlled so that the wafer is transmitted in parallel with the anode member in the plating solution, and thus areas onto which the light is not emitted by the anode members may be uniformly distributed on the surface of the wafer.

Hereinafter, a plating method of one implementation of the disclosed technology in this patent document using the plating equipment will be described.

In one implementation, a LIP plating may be performed through a second plating unit, and then electroplating may be performed by using a first plating unit. In the electroplating process on the wafer substrate for solar cells, a seed layer may be formed on the surface of the wafer to secure uniform application of a film and excellent interlayer adhesion strength. An LED lamp located at each of both sides of a plating bath is turned on, and the light-induced plating is performed by irradiating light onto the wafer, i.e., a body to be plated that is vertically mounted at a center of the plating bath. Therefore, the seed layer may be formed on both sides of the wafer to increase conductivity of the surface of the wafer.

Next, the electroplating may be performed on both surfaces of the wafer on which the seed layer is formed by using the anode members disposed in the front side of the LED lamp. Thus, the electroplating may be effectively performed through a single process in a single plating equipment.

A controller connected to the plating equipment may control the electroplating process for the wafer so that the LIP plating is performed first and then the electroplating is performed. Alternatively, the controller may control the elements of the plating equipment so that the LIP and the electroplating are concurrently performed.

According to implementations of the disclosed technology in this patent document, since the anode is disposed on each of both sides of the plating bath facing the cathode located at the center of the plating bath, both sides of the wafer may be simultaneously plated without performing a masking process. In other words, a product may be produced through only one single process, whereas the conventional equipment requires the electroplating process two times, i.e., following processes: front surface masking→back surface plating→front surface masking delamination→back surface masking→front surface plating→back surface masking delamination.

Therefore, the scope of embodiments of the present invention is not limited to the specific embodiments. Also, it will be understood that the embodiments disclosed in this specification includes some variations without limitations to the shapes as illustrated in the figures. Therefore, the exemplary embodiments of the present invention were described in detail with reference to the accompanying drawings. The description of the present invention is intended to be illustrative, and those with ordinary skill in the technical field of the present invention pertains will be understood that the present invention can be carried out in other specific forms without changing the technical idea or essential features.

The invention claimed is:

1. A plating equipment comprising:
   a jig holding a wafer to be plated at a center of a plating bath such that the wafer is vertically immersed into a plating solution in the plating bath;
   a first plating unit including a first plurality of anode members disposed on a first side of the plating bath facing the wafer, and a second plurality of anode members disposed on a second side of the plating bath facing the wafer, the first plating unit performing electroplating; and
   a second plating unit disposed in a light source receiving unit physically blocked from the first plating unit, the second plating unit being disposed behind the first plurality of anode members and the second plurality of anode members to perform light-induced plating by using a light emitting diode (LED) lamp irradiating light onto the wafer;
   wherein the first plurality of anode members and the second plurality of anode members are symmetrically disposed with respect to the wafer;
   wherein each member of the first plurality of anode members has a same width and is spaced apart at the same distance as a width of other members of the first plurality of anode members, and
   wherein each member of the second plurality of anode members has a same width and is spaced apart at the same distance as a width of other members of the second plurality of anode members.

2. The plating equipment of claim 1, when the light-induced plating is performed, the jig is controlled to move the wafer in a direction parallel to that of the first and second pluralities of anode members so that an area on which reception of light emitted from the LED lamp is disrupted due to a position of the anode members is uniformly distributed on the surface of the wafer.

3. The plating equipment of claim 1, wherein a barrier is disposed between the first and second plating units to prevent the plating solution in the plating bath from being permeated into the light source receiving unit, and the barrier is formed of a transparent material through which light is transmitted.

4. The plating equipment of claim 3, wherein a ventilation hole or an air blower is disposed in a surface opposite to the plating bath of the light source receiving unit to prevent dew from being generated on the barrier when the LED lamp operates.

5. The plating equipment of claim 1, wherein if the second plating unit performs the light induced plating, a seed layer is formed on the surface of the wafer.

6. The plating equipment of claim 1, wherein each member of the first plurality of anode members comprises a globular anode ball put into a cylindrical anode bus bar.

7. The plating equipment of claim 1, wherein each member of the first plurality of anode members or the second plurality of anode members comprises a star shaped section that is hung on an anode hook.

8. The plating equipment of claim 1, wherein each member of the first plurality of anode members or the second plurality of anode members comprise a titanium basket.

9. A plating equipment comprising:
   a jig holding a wafer to be plated in a middle of the plating bath and moving at a predetermined speed in a longitudinal direction of the plating bath;
   a first plurality of anode members disposed on a first side of the plating bath facing the wafer to perform electroplating, and a second plurality of anode members disposed on a second side of the plating bath facing the wafer to perform electroplating; and light source receiving units disposed behind each anode member to perform light-induced plating by using a light emitting diode (LED) lamp irradiating light onto the wafer;

wherein the first plurality of anode members and the second plurality of anode members are symmetrically disposed with respect to the wafer, wherein the first plurality of anode members have a same width and are uniformly spaced apart from one another at a same distance as a width of each of the first plurality of anode members, and wherein the second plurality of anode members have a same width and are uniformly spaced apart from one another at a same distance as a width of each of the second plurality of anode members.

10. The plating equipment of claim 9, wherein the jig is controlled to move the wafer in a direction parallel to that of the anode member so that an area on which reception of light emitted from the LED lamp is disrupted due to a position of the anode members is uniformly distributed on the surface of the wafer.

11. The plating equipment of claim 9, wherein each member of the first plurality of anode members comprises a globular anode ball put into a cylindrical anode bus bar.

12. The plating equipment of claim 9, wherein each member of the first plurality of anode members or the second plurality of anode members comprises a star shaped section that is hung on an anode hook.

13. The plating equipment of claim 9, wherein each member of the first plurality of anode members or the second plurality of anode members comprise a titanium basket.

* * * * *